United States Patent
Lin et al.

(10) Patent No.: US 7,080,282 B2
(45) Date of Patent: Jul. 18, 2006

(54) METHOD FOR DETERMINING AN OPERATING VOLTAGE OF FLOATING POINT ERROR DETECTION

(75) Inventors: Tsung-Yi Lin, Taipei (TW); Chia-Hsing Yu, Taipei Hsien (TW); Lin-Hung Chen, Taipei (TW)

(73) Assignee: VIA Technologies Inc., Hsin-Tien (TW)

( * ) Notice: Subject to any disclaimer, the term of this patent is extended or adjusted under 35 U.S.C. 154(b) by 389 days.

(21) Appl. No.: 10/063,772

(22) Filed: May 11, 2002

(65) Prior Publication Data
US 2003/0126500 A1    Jul. 3, 2003

(30) Foreign Application Priority Data
Dec. 28, 2001  (TW) ............................... 90133000 A

(51) Int. Cl.
*G06F 11/00*     (2006.01)
(52) U.S. Cl. ............................ 714/25; 713/300; 327/77
(58) Field of Classification Search ................ 714/9, 714/25, 10, 30, 37, 709, 721; 324/73.1, 500, 324/509, 522, 523, 524, 537
See application file for complete search history.

(56) References Cited

U.S. PATENT DOCUMENTS

| | | | | |
|---|---|---|---|---|
| 5,343,086 A | * | 8/1994 | Fung et al. | 327/63 |
| 5,534,801 A | * | 7/1996 | Wu et al. | 327/72 |
| 5,632,039 A | * | 5/1997 | Walker et al. | 713/300 |
| 5,689,202 A | * | 11/1997 | Ranson | 327/142 |
| 5,818,206 A | * | 10/1998 | Titus et al. | 323/285 |
| 6,691,235 B1 | * | 2/2004 | Garcia et al. | 713/300 |
| 2003/0126500 A1 | | 7/2003 | Lin et al. | |

* cited by examiner

*Primary Examiner*—Robert Beausoliel
*Assistant Examiner*—Philip Guyton
(74) *Attorney, Agent, or Firm*—Winston Hsu

(57) ABSTRACT

A method for determining an operating voltage of floating point error detection is implemented by a central processing unit (CPU) and a south bridge chipset. The CPU has a first output port connected to a test port of the south bridge. The test port is used to determine an operating voltage of the CPU. If the operating voltage of the CPU is greater than a predetermined value, the first output port is floating. If the operating voltage of the CPU is smaller than the predetermined value, the first output port is grounded. The method includes using a power supply and a resistor to provide a bias voltage and for measuring a voltage of the test port to determine the operating voltage of the CPU.

8 Claims, 4 Drawing Sheets

METHOD FOR DETERMINING AN OPERATING VOLTAGE OF FLOATING POINT ERROR DETECTION

BACKGROUND OF INVENTION

1. Field of the Invention

The present invention relates to a method for determining an operating voltage of floating point error detection of a central processing unit (CPU), and more specifically, the present invention discloses a method for determining an operating voltage of floating point error detection of a CPU via a south bridge chipset.

2. Description of the Prior Art

With the rapid development of computers, development of CPU technology has become important. Computers with Intel x86 architecture used to require floating point co-processors (math co-processors) to effectively perform floating point calculations. More recently, manufacturers have embedded floating point units (FPU) into their CPUs, thereby increasing floating point calculation speed substantially. Currently, many CPUs on the market use this concept to deliver high processing speeds.

In a typical computer system there are two types of numerical data, integers and floating point numbers. Storing an integer in a computer system is relatively simple, but a floating point number must be represented as an integer part, a fractional part, and an exponent. One can appreciate the methods of performing calculations on an integer and floating point number are quite different, with floating point operations being much more complicated.

The processing speed of today's CPUs has reached the gigahertz level and the latest software uses this potential to the fullest. For example, animation software that performs rendering and texture mapping functions needs to execute a large number of floating point calculations during a short period. With this high rate of floating point calculations comes the risk of floating point errors in the FPU. If an error does occur, the CPU will indicate such by a floating point error signal (FERR#) that is sent to a south bridge chipset on the motherboard for further processing.

In order for the south bridge chipset to correctly interpret the FERR# and properly recognize that a floating point error has occurred, the south bridge chipset must first establish the operating voltage of the floating point error. In practical application, the operating voltage of the floating point error is the operating voltage of the CPU. Now suppose that the operating voltage of the CPU is 2 volts. That is, the FERR# output by the CPU will be between 0 and 2 volts. If the FERR# accepted by the south bridge chipset is greater than 1 volt, a corresponding binary digital value represented by the FERR# is "1". Similarly, if the FERR# accepted by the south bridge chipset is smaller than 1 volt, the corresponding binary digital value represented by the FERR# is "0".

It is often the case that CPUs of the same manufacturer have different operating voltages. For example, an Intel Pentium II processor operates at 1.5 volts yet an Intel Pentium III processor runs at 2.5 volts. As the south bridge chipset requires the operating voltage of the floating point error to correctly interpret FERR#, the south bridge chipset needs to first determine the operating voltage of the CPU.

Please refer to FIG. 1. FIG. 1 is a flow chart that describes setting an operating voltage of floating point error detection according to the prior art.

Step 101: a basic input/output system (BIOS) accesses identification data of the CPU;

Step 102: the BIOS determines an operating voltage of the CPU based on the identification data of the CPU;

Step 103: is the operating voltage of the CPU 1.5 volts? if so, go to step 104; if not, go to step 105;

Step 104: the operating voltage of floating point error detection is 1.5 volts;

Step 105: the operating voltage of floating point error detection is 2.5 volts.

As shown above, the BIOS is an essential element in determining the operating voltage of floating point error detection of the CPU. If the BIOS malfunctions or otherwise introduces an error into the system, the operating voltage of floating point error detection will not be correctly determined. To avoid errors, manufacturers must currently ensure compatibility by testing BIOS systems with the wide array of CPUs available and their numerous identification data and operating voltages.

SUMMARY OF INVENTION

It is therefore a primary objective of the claimed invention to provide a method for determining an operating voltage of floating point error detection utilizing a south bridge chipset to eliminate dependency on a BIOS.

The claimed invention, briefly summarized, discloses a method for determining an operating voltage of floating point error detection. The method is implemented by a CPU and a south bridge chipset. The CPU has a first output port connected to a test port of the south bridge chipset. The test port is used to determine an operating voltage of the CPU. If the operating voltage of the CPU is greater than a predetermined value, the first output port is floating. If the operating voltage of the CPU is smaller than the predetermined value, the first output port is grounded. The method includes using a power supply and a resistor to provide a bias voltage and measuring a voltage of the test port to determine the operating voltage of the CPU.

It is an advantage of the claimed invention that the claimed voltage detecting circuit utilizes the floating and grounded states of the first output port of the CPU to allow the south bridge chipset to determine the operating voltage of floating point error detection. Therefore, the claimed voltage detecting circuit does not require support of the prior BIOS to determine the operating voltage of floating point error detection. Removing dependency on the BIOS reduces the chance of an error occurring and simplifies CPU and BIOS compatibility testing.

These and other objectives and advantages of the claimed invention will no doubt become obvious to those of ordinary skill in the art after reading the following detailed description of the preferred embodiment that is illustrated in the various figures and drawings.

DETAILED DESCRIPTION

Figure 1:
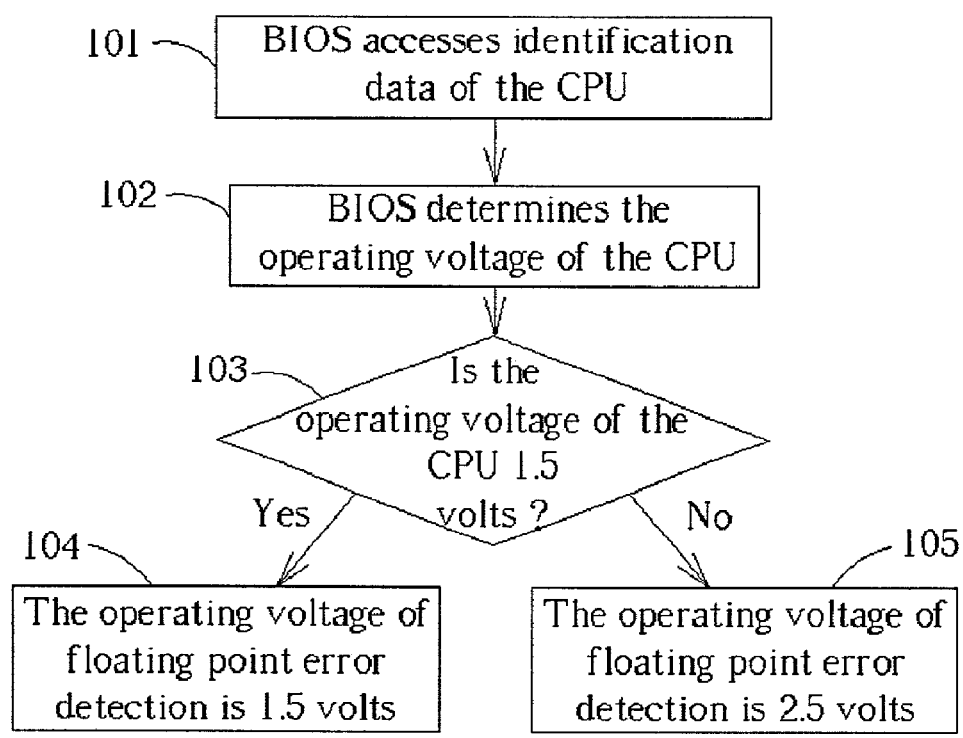
FIG. 1 is a flow chart that describes setting an operating voltage of floating point error detection according to the prior art.
Figure 2:
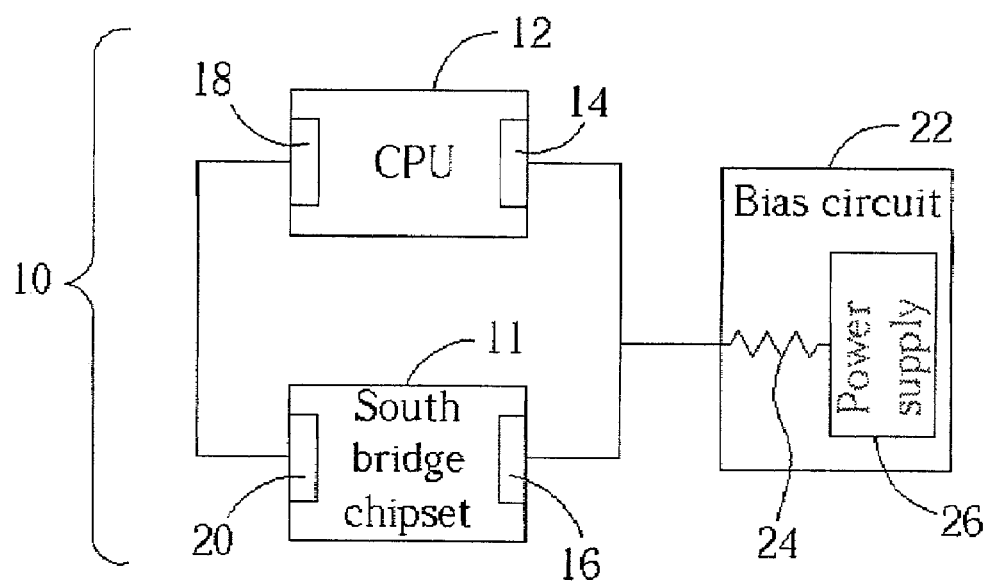
FIG. 2 is a block diagram of an operating voltage detecting circuit of a computer system according the present invention.
Figure 3:
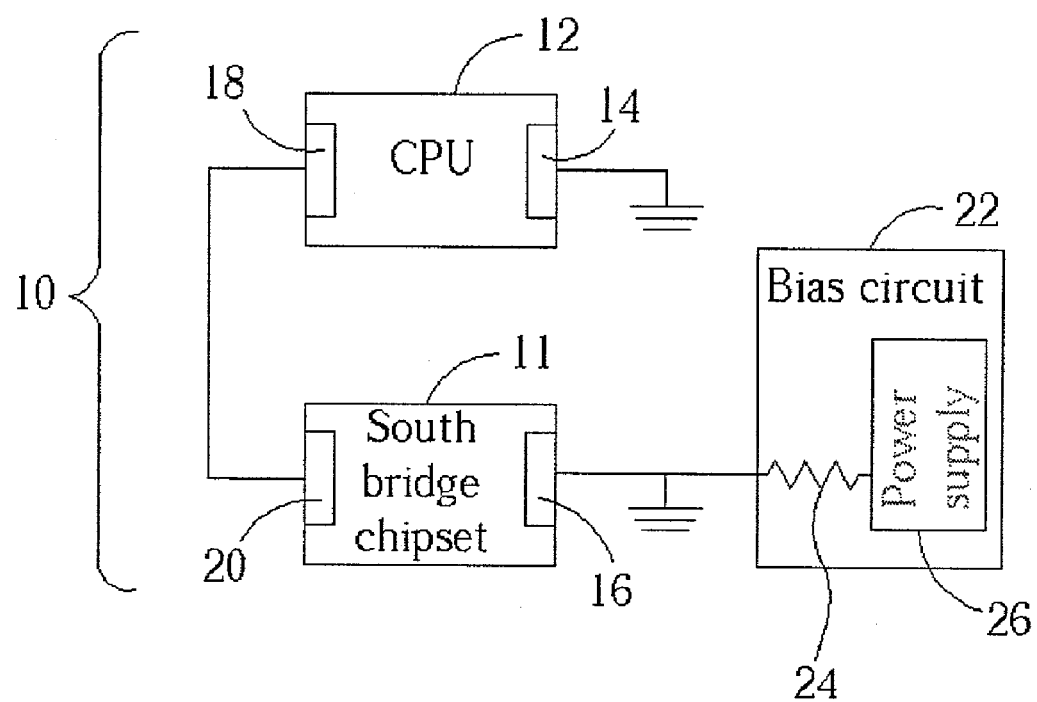
FIG. 3 and FIG. 4 are block diagrams of equivalent circuits of the operating voltage detecting circuit shown in FIG. 2.
Figure 4:
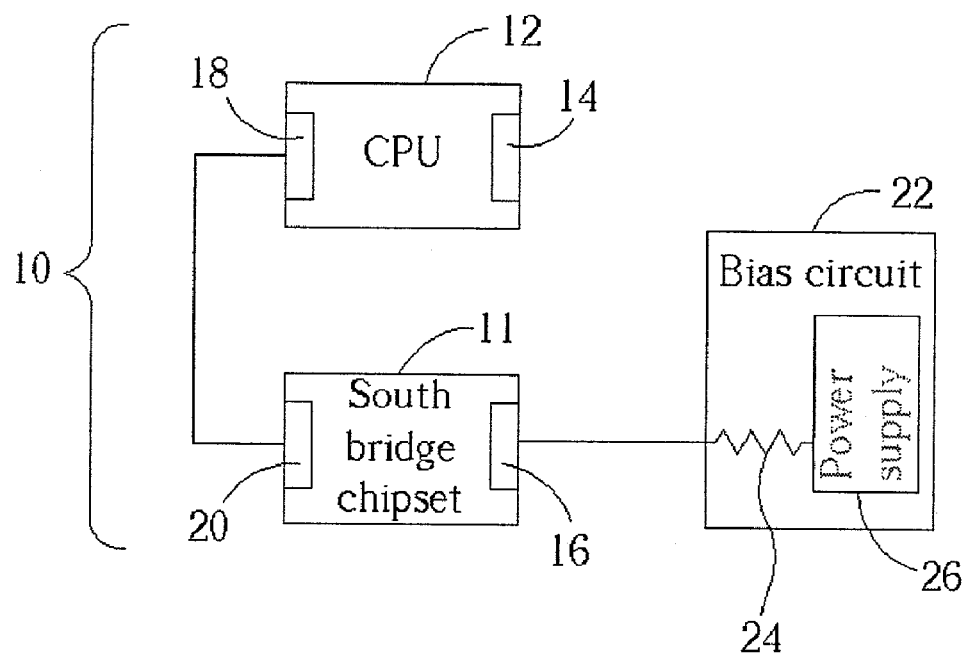

Please refer to FIG. 2 to FIG. 4. FIG. 2 is a block diagram of an operating voltage detecting circuit of a computer system 10 according to the present invention. FIG. 3 and FIG. 4 are block diagrams of equivalent circuits of the operating voltage detecting circuit shown in FIG. 2. As shown in FIG. 2, the computer system 10 comprises a CPU 12, a south bridge chipset 11, and a bias circuit 22. The CPU 12 comprises a first output port 14 connected to a test port 16 of the south bridge chipset 11 for generating a corresponding output according to an operating voltage of the CPU 12, and a second output port 18 connected to a signal input port 20 of the south bridge chipset 11 for outputting a floating point error signal (FERR#). The bias circuit 22, which comprises a resistor 24 and a power supply 26, is connected to the first output port 14 of the CPU 12 and the test port 16 of the south bridge chipset 11 for providing a voltage level. If the operating voltage of the CPU 12 is higher than a first predetermined voltage level, the first output port 14 is in a floating state. If the operating voltage of the CPU 12 is lower than the first predetermined voltage level, the first output port 14 is in a grounded state.

Consider, for example, the Intel Pentium II and Pentium III CPUs, which have operating voltages of 1.5 volts and 2.5 volts respectively. Suppose also that the first predetermined voltage level is 2 volts.

As shown in FIG. 3, when the operating voltage of the CPU 12 is 1.5 volts (e.g. Pentium II), the first output port 14 is in the grounded state. Therefore, the bias circuit 22 provides a ground voltage to the test port 16 of the south bridge chipset 11. The south bridge chipset 11 can then utilize the ground voltage detected by the test port 16, which has a binary digital value "0", to determine that the operating voltage of the CPU is 1.5 volts, and that the operating voltage of floating point error detection is also 1.5 volts.

As shown in FIG. 4, when the operating voltage of the CPU 12 is 2.5 volts (e.g. Pentium III), the first output port 14 is in the floating state. Therefore, the bias circuit 22 provides a bias voltage, which corresponds to the operating voltage of the south bridge chipset 11, to the test port 16 of the south bridge chipset 11 through the power supply 26 and the resistor 24. The south bridge chipset 11 can utilize the bias voltage detected by the test port 16, which has a binary digital value "1", to determine that the operating voltage of the CPU is 2.5 volts, and to determine that the operating voltage of floating point error detection is also 2.5 volts.

Thus, the south bridge chipset 11 can correctly determine if the FERR# accepted by the signal input port 20 is "1" or "0" by referencing the operating voltage of floating point error detection.

As illustrated by the example above, the south bridge chipset 11 obtains the operating voltage of the CPU 12 through the voltage level detected by the test port 16 so as to determine the operating voltage of floating point error detection. When the test port 16 receives a signal, where the voltage of the signal is higher than a second predetermined voltage level, the first output port of the CPU 12 is in the floating state. Therefore, the operating voltage of the CPU 12 is higher than the first predetermined voltage level. Furthermore, when the test port 16 receives a signal, where the voltage of the signal is lower than the second predetermined voltage level, the first output port of the CPU 12 is in the grounded state. Therefore, the operating voltage of the CPU 12 is lower than the first predetermined voltage level. In general, the south bridge chipset 11 of the preferred embodiment is used to determine different operating voltages of the CPU 12, and to further set the corresponding operating voltage of floating point error detection.

In contrast to the prior art, the present invention utilizes the floating and grounded states of the first output port of the CPU to allow the south bridge chipset to obtain the actual operating voltage of the CPU and operating voltage of floating point error detection via the voltage level provided by the bias circuit. The BIOS need not be used so the possibility of it causing an error in determining the operating voltage of floating point error is eliminated. Furthermore, BIOS, motherboard, and CPU compatibility testing is simplified.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for determining an operating voltage of floating point error detection of a central processing unit (CPU) through a south bridge chipset; said CPU comprising a first output port, wherein said first output port is floating when said operating voltage of floating point error detection of said CPU is higher than a first predetermined voltage level, and said first output port is connected to a grounding when said operating voltage of floating point error detection of said CPU is lower than said first predetermined voltage level; said south bridge chipset comprising a test port connected to the first output port of said CPU for determining said operating voltage of floating point error detection of said CPU;

said method comprising:
providing a power supply connected to the first output port of said CPU via a resistor for supplying a first voltage level; and
measuring a voltage level at said test port of said south bridge chipset to determine said operating voltage of floating point error detection of said CPU.

2. The method of claim 1 wherein said first voltage level is a positive voltage, said operating voltage of said CPU is higher than said first predetermined voltage level when said voltage level at said test port of said south bridge chipset is higher than a second predetermined voltage level, and said operating voltage of said CPU is lower than said first predetermined voltage level when said voltage level at said test port of said south bridge chipset is lower than said second predetermined voltage level.

3. The method of claim 1 wherein said CPU further comprises a second output port connected to a signal input port of said south bridge chipset for transmitting a predetermined signal;

said method further comprising:
determining information contained in said predetermined signal according to said operating voltage of floating point error detection of said CPU.

4. The method of claim 3 wherein said predetermined signal is a floating point error signal (FERR#) of said CPU.

5. A method for determining an operating voltage of floating point error detection of a central processing unit (CPU) through a control circuit; said CPU comprising a first output port, wherein said first output port is floating when said operating voltage of floating point error detection of said CPU is higher than a first predetermined voltage level, and said first output port is connected to a grounding when said operating voltage of floating point error detection of said CPU is lower than said first predetermined voltage level; said CPU further comprising a second output port connected to a signal input port of said control circuit for transmitting a predetermined signal; said control circuit comprising a test port connected to the first output port of said CPU for determining said operating voltage of floating point error detection of said CPU;

said method comprising:
- providing a power supply connected to the first output port of said CPU via a resistor for supplying a first voltage level;
- measuring a voltage level at said test port of said control circuit to determine said operating voltage of floating point error detection of said CPU; and
- determining information contained in said predetermined signal according to said operating voltage of floating point error detection of said CPU.

6. The method of claim 5 wherein said first voltage level is a positive voltage, said operating voltage of said CPU is higher than said first predetermined voltage level when said voltage level at said test port of said control circuit is higher than a second predetermined voltage level, and said operating voltage of said CPU is lower than said first predetermined voltage level when said voltage level at said test port of said control circuit is lower than said second predetermined voltage level.

7. The method of claim 5 wherein said control circuit is a south bridge chipset.

8. The method of claim 5 wherein said predetermined signal is a floating point error signal (FERR#) of said CPU.

* * * * *